United States Patent
Nunomura et al.

(10) Patent No.: US 6,232,032 B1
(45) Date of Patent: May 15, 2001

(54) PHOTOSENSITIVE POLYMER COMPOSITION, METHOD FOR FORMING RELIEF PATTERNS, AND ELECTRONIC PARTS

(75) Inventors: Masataka Nunomura; Noriyuki Yamazaki, both of Ibaraki (JP)

(73) Assignees: Hitachi Chemical DuPont Microsystems L.L.C., Wilmington, DE (US); Hitachi Chemical DuPont Microsystems Ltd., Tokyo (JP)

( * ) Notice: Subject to any disclaimer, the term of this patent is extended or adjusted under 35 U.S.C. 154(b) by 0 days.

(21) Appl. No.: 09/321,316

(22) Filed: May 27, 1999

(30) Foreign Application Priority Data

| May 29, 1998 | (JP) | 10-149943 |
| Dec. 24, 1998 | (JP) | 10-367183 |
| Mar. 29, 1999 | (JP) | 11-086994 |

(51) Int. Cl.$^7$ .................................................. G03F 7/023
(52) U.S. Cl. .................. 430/191; 430/192; 430/193; 430/270.1; 430/326
(58) Field of Search .................... 430/191, 192, 430/193, 270.1, 326, 18, 14

(56) References Cited

U.S. PATENT DOCUMENTS

| 4,927,736 | * | 5/1990 | Mueller et al. | 430/275.1 |
| 5,021,320 | * | 6/1991 | Mueller et al. | 430/192 |
| 5,104,768 | | 4/1992 | Sassmannshausen et al. | 430/192 |
| 5,573,886 | * | 11/1996 | Kato et al. | 430/192 |
| 5,585,217 | * | 12/1996 | Oba et al. | 430/191 |
| 5,753,407 | | 5/1998 | Oba | 430/191 |
| 6,071,666 | * | 6/2000 | Hirano et al. | 430/191 |

FOREIGN PATENT DOCUMENTS

| 0 459 395 A2 | 12/1991 | (EP) | G03F/7/023 |
| 0 478 321 A1 | 1/1992 | (EP) | G03F/7/038 |
| 0 810 476 A1 | 12/1997 | (EP) | G03F/7/023 |
| 55-30207 | 8/1980 | (JP) | C08F/1/16 |
| 60-37550 | 2/1985 | (JP) | C08G/73/10 |
| 3-36861 | 6/1991 | (JP) | C08G/73/10 |
| 4-204945 | 7/1992 | (JP) | C03F/7/023 |
| 7-219216 | 8/1995 | (JP) | . |

* cited by examiner

Primary Examiner—John S. Chu
(74) Attorney, Agent, or Firm—Griffin & Szipl, P.C.

(57) ABSTRACT

Disclosed are a photosensitive polymer composition comprising (a) a polymer soluble in an aqueous alkaline solution, (b) an o-quinonediazide compound, and (c) a dissolution inhibitor for the component (a) in an aqueous alkaline solution; a method of using the composition for forming relief patterns; and electronic parts having, as a passivating film or an interlayer insulating film, the relief pattern as formed in the method. The composition has high sensitivity, and give fine relief patterns having a good profile.

11 Claims, 1 Drawing Sheet

PHOTOSENSITIVE POLYMER COMPOSITION, METHOD FOR FORMING RELIEF PATTERNS, AND ELECTRONIC PARTS

BACKGROUND OF THE INVENTION

1. Field of the Invention

The present invention relates to a photosensitive polymer composition, to a method of using the composition for forming relief patterns, and to electronic parts. More precisely, it relates to a positive tone, heat-resistant photosensitive polymer composition capable of being converted into a heat-resistant polyimide polymer under heat, which is suitable for passivating films, interlayer insulating films and others for electronic parts such as semiconductor devices, etc.; to a method of using the composition for forming relief patterns; and to electronic parts.

2. Description of the Related Art

Polyimides have good heat resistance and good mechanical properties, and are readily formed into films of which the surface could be well planarized. Having those advantages, they are widely used for passivating films, interlayer insulating films and others for semiconductor devices.

Where polyimides are used for passivating films or interlayer insulating films, the step of forming through-holes and the like in those films is achieved essentially in an etching process in which a positive tone photo-resist is used. However, the step comprises applying and removing such a photo-resist, by which the step is complicated. This is the problem with the step. For the purpose of rationalizing the working step, heat-resistant materials with photosensitivity have heretofore been studied.

Relative to photosensitive polyimide compositions, for example, known are (1) a polyimide precursor composition in which is introduced a photosensitive group through ester bonding (JP-B 52-30207, etc.), and (2) a composition as prepared by adding a compound that contains a carbon-carbon double bond capable of being dimerized or polymerized by the action of chemical rays, an amino group and an aromatic bisazide, to a polyamidic acid (JP-B 3-36861, etc.).

In use of such photosensitive polyimide compositions, in general, a solution of the composition is applied onto a substrate, then dried, and exposed to active rays via a mask, and thereafter the unexposed area is removed with a developer to form a pattern on the substrate.

However, the compositions (1) and (2) noted above are both negative tone ones, and the development for these requires an organic solvent. Therefore, when an etching process using a positive tone photo-resist is switched to a process using a negative tone photosensitive polyimide, the problem is that the mask for the exposure device and the development equipment must be changed.

On the other hand, relative to positive tone photosensitive polyimides, for example, known are (3) a polyimide precursor in which is introduced an o-nitrobenzyl group through ester bonding (JP-A 60-37550), and (4) a composition comprising a phenolic hydroxyl group-having plyamidate and an o-quinonediazide compound (JP-A 4-204945).

However, the precursor (3) is essentially sensitive to light having a wavelength of not longer than 300 nm, and its sensitivity is low. Therefore, the precursor (3) is problematic in that an i-line stepper (for single wavelength light of 365 nm) which is much used these days in the art is hardly applicable thereto. On the other hand, the composition (4) is also problematic in that its sensitivity is still unsatisfactory even though higher than the sensitivity of the precursor (3). At present, no one could obtain positive tone photosensitive polyimides having satisfactorily good sensitivity.

SUMMARY OF THE INVENTION

The present invention is to overcome the problems noted above in the related art.

Specifically, the invention as herein claimed in claims 1 to 10 is to provide a positive tone photosensitive polymer composition having high sensitivity and capable of being formed into patterns having a good profile. In patterning the composition, the film retention in the unexposed area is high.

In particular, the photosensitive polymer composition as claimed in claims 2 to 4 has extremely good heat resistance.

The invention as claimed in claims 11 and 12 is to provide a method of using the composition for forming relief patterns having a high resolution and having a good profile.

The invention as claimed in claims 13 and 14 is to provide electronic parts having fine relief patterns, in which the relief patterns formed have a good profile and which therefore have high reliability.

The photosensitive polymer composition of the invention comprises (a) a polymer soluble in an aqueous alkaline solution, (b) an o-quinonediazide compound, and (c) a dissolution inhibitor for the component (a) in an aqueous alkaline solution.

In the composition, preferably, the component (a) is a polyimide or its precursor soluble in an aqueous alkaline solution.

Also preferably, the component (a) is a polybenzoxazole precursor soluble in an aqueous alkaline solution.

Still preferably, the component (a) is a polyamic acid ester having repetitive units of a general formula (I):

wherein $R^1$ represents a tetravalent organic group; $R^2$ represents a divalent organic group having a carboxyl group or a phenolic hydroxyl group; and two $R^3$'s each independently represent a monovalent organic group.

Still preferably, the component (c) in the composition is any of onium salts, diaryl compounds or tetraalkylammonium salts.

Still preferably, the component (c) is any of diaryliodonium salts, diaryl sulfone compounds or tetramethylammonium halide compounds.

Still preferably the component (c) is a diaryliodonium salt of a general formula (II):

wherein $R^4$ and $R^5$ each independently represent a monovalent organic group, and these $R^4$ and $R^5$ may be the same or different; m and n each independently represent an integer of from 0 to 5; and X represents a counter anion.

Still preferably, the composition comprises from 5 to 100 parts by weight of the component (b) and from 0.01 to 30 parts by weight of the component (c), relative to 100 parts by weight of the component (a).

The method of the invention of using the photosensitive polymer composition for forming relief patterns comprises a step of applying the composition onto a substrate and drying it thereon, a step of exposing it, a step of developing it with an aqueous alkaline solution, and a step of heating it.

Preferably, in the method, the light to be used in the exposing step is of i-lines.

The electronic parts of the invention have the relief patterns as formed in the method noted above, in which the relief patterns act as a passivating film or an interlayer insulating film.

BRIEF DESCRIPTION OF THE DRAWING

1. Semiconductor Substrate
2. Protective Film
3. First Conductor Layer
4. Interlayer Insulating Film
5. Photosensitive Resin Layer
6A. Window
6B. Window
6C. Window
7. Second Conductor Layer
8. Passivating Layer

DETAILED DESCRIPTION OF THE INVENTION

In the photosensitive polymer composition of the invention, the component (a) is a polymer that is soluble in an aqueous alkaline solution, and generally has an acid group. The acid group includes, for example, a carboxyl group, a phenolic hydroxyl group, a sulfo group, etc. The polymer for use in the invention preferably has a carboxyl group or a phenolic hydroxyl group. Having such an acid group, the polymer is soluble in an aqueous alkaline solution which is used as a developer. After having been exposed, the solubility of the exposed area of the film of the polymer composition is increased due to the change in the o-quinonediazide compound of the component (b) in the composition, whereby the exposed area comes to differ from the unexposed area in the dissolution rate to give a relief pattern.

The aqueous alkaline solution is an aqueous solution which contains tetramethylammonium hydroxide, a metal hydroxide, an amine or the like as dissolved in water and is alkaline.

Regarding the type of the polymer for use in the invention, preferred are polymers having good heat resistance, for example, polyimide precursors such as polyamidic acids, polyamic acid esters, polyamidic acid amides, etc.; polyoxazole precursors such as polyhydroxyamides, etc.; as well as other polyamides, polyimides, polybenzoxazoles, etc., as the patterned films to be formed from them have good physical properties including heat resistance, etc.

Of those, more preferred are polyimide precursors, polyimides and polyoxazole precursors, as the cured relief pat- terns from them have especially good heat resistance. Above all, even more preferred are polyamic acid esters having repetitive units of formula (I) noted above, as their adhesiveness to substrates is good.

In formula (I), the tetravalent organic group represented by $R^1$ is a residue of a tetracarboxylic acid or its dianhydride or derivative capable of reacting with a diamine to form a polyimide structure, and this is preferably a tetravalent aromatic or aliphatic group, more preferably having from 4 to 40 carbon atoms. Even more preferably, $R^1$ is a tetravalent aromatic group having from 4 to 40 carbon atoms. The aromatic group is one containing an aromatic ring (e.g., benzene ring, naphthalene ring, etc.). In the tetravalent aromatic group, preferably, all four bonding sites are on the aromatic ring. The bonding sites are grouped into two pairs, and it is desirable that the two bonding sites of each one pair are positioned in the ortho- or peri-position in the aromatic ring. The two pairs of the bonding sites may be on one and the same aromatic ring, or may be on different aromatic rings as bonded to each other in any desired bonding manner.

In formula (I), the divalent organic group having a carboxyl group or a phenolic hydroxyl group, which is represented by $R^2$, is a residue as derived from a diamine compound having a carboxyl group or a phenolic hydroxyl group by removing the amino groups from the compound, and this is capable of reacting with a tetracarboxylic acid to form a polyimide structure. The divalent organic group is preferably an aromatic or aliphatic group, more preferably having from 2 to 40 carbon atoms. Even more preferably, this is an aromatic group in which the number of the carbon atoms falls within the defined range. In the divalent aromatic group, preferably, the two bonding sites are directly on the aromatic ring. In this, the two bonding sites may be on one and the same aromatic ring, or may be on different aromatic rings. It is desirable that the divalent aromatic group has from 1 to 8 carboxyl groups or phenolic hydroxyl groups and that these carboxyl or phenolic hydroxyl groups are directly on the aromatic ring.

In formula (I), the monovalent organic group represented by $R^3$ is preferably an aliphatic or aromatic hydrocarbon group, more preferably having from 1 to 20 carbon atoms.

The polyamic acid esters may optionally have any other repetitive units in addition to the repetitive units of formula (I). For example, they may have repetitive units of the following general formula (III):

(III)

wherein $R^6$ represents a tetravalent organic group; $R^7$ represents a divalent organic group having neither a carboxyl group nor a phenolic hydroxyl group; and $R^8$ represents a monovalent organic group.

In formula (III), for the tetravalent organic group represented by $R^6$, referred to are the same as those mentioned hereinabove for $R^1$. Also in formula (III), for the divalent organic group having neither a carboxyl group nor a phenolic hydroxyl group, which is represented by $R^7$, referred to are the same as those mentioned hereinabove for $R^2$ except that the groups for $R^7$ shall have neither a carboxyl group nor a phenolic hydroxyl group. Further in formula (III), the monovalent organic group represented by $R^8$, referred to are the same as those mentioned hereinabove for $R^3$.

The component (a) may further have still other repetitive units of formula (I) or (III) in which one or both of the two $R^3$'s or the two $R^8$'s is/are hydrogen atom(s).

In the component (a), it is desirable that the ratio of the repetitive units of formula (I) to those of formula (III) falls between 0.2 and 1, more preferably between 0.4 and 1, in terms of o/(o+p) in which o indicates the number of the repetitive units of formula (I) and p indicates that of the repetitive units of formula (III). If the ratio is smaller than 0.2, the solubility of the component (a) in an aqueous alkaline solution will be poor.

In the polyamic acid ester of the component (a), it is desirable that the sum total of the repetitive units of formulae (I) and (III), or that is, the sum total of the repetitive units of completely-esterified carboxyl groups in the tetracarboxylic acid residues falls between 50% and 100%, more preferably between 80% and 100%, even more preferably between 90% and 100%, relative to all repetitive units constituting the polyamic acid ester. One repetitive unit as referred to herein is composed of one acid residue and one amine residue.

Preferably, the component (a) has a weight-average molecular weight of from 3,000 to 200,000, more preferably from 5,000 to 100,000. The molecular weight is measured through gel permeation chromatography, based on the calibration curve of a polystyrene standard.

One repetitive unit of formulae (I) and (III) has two groups of $R^3$ and two groups of $R^8$, and those two groups may be the same or different. In plural repetitive units of those formulae, the groups of $R^1$, $R^2$, $R^3$, $R^4$, $R^5$, $R^6$, $R^7$ and $R^8$ may be the same or different.

In the invention, the polyamic acid esters may be prepared, for example, by reacting a tetracarboxylic acid diester dihalide (e.g., chloride, bromide, etc.) with a diamine compound having a carboxyl group or a phenolic hydroxyl group and optionally with a diamine compound not having a carboxyl group or a phenolic hydroxyl group. In this case, the reaction is preferably effected in the presence of a dehydrohalogenation catalyst in an organic solvent.

As the tetracarboxylic acid diester dihalide, preferred are tetracarboxylic acid diester dichlorides. The tetracarboxylic acid diester dichlorides may be prepared by reacting a tetracarboxylic acid diester, which is obtained through reaction of a tetracarboxylic acid dianhydride and an alcohol compound, with thionyl chloride.

As the starting material for the polyamic acid esters and as that for other polyimide precursors and polyimides, generally employed are tetracarboxylic acid dianhydrides. As the tetracarboxylic acid dianhydrides, for example, preferred are aromatic tetracarboxylic acid dianhydrides such as pyromellitic acid dianhydride, 3,3',4,4'-biphenyltetracarboxylic acid dianhydride, 2,3,3',4'-biphenyltetracarboxylic acid dianhydride, 2,2',3,3'-biphenyltetracarboxylic acid dianhydride, 3,3',4,4'-benzophenonetetracarboxylic acid dianhydride, 3,3',4,4'-biphenylethertetracarboxylic acid dianhydride, 3,3',4,4'-diphenylsulfone-tetracarboxylic acid dianhydride, 1,2,3,4-cyclopentanetetracarboxylic acid dianhydride, 1,2,5,6-naphthalenetetracarboxylic acid dianhydride, 2,3,6,7-naphthalenetetracarboxylic acid dianhydride, 1,4,5,8-naphthalenetetracarboxylic acid dianhydride, 2,3,5,6-pyridine-tetracarboxylic acid dianhydride, 3,4,9,10-perylenetetracarboxylic acid dianhydride, 3,3',4,4'-diphenylsulfone-tetracarboxylic acid dianhydride, 3,3',4,4'-tetraphenylsilane-tetracarboxylic acid dianhydride, 2,2-bis(3,4-dicarboxyphenyl)hexafluoropropane dianhydride, etc. One or more of these may be used either singly or as combined.

In the polyamic acid esters, alcohol compounds may be used as the starting material for the ester moiety. As the alcohol compounds, for example, preferred are alkyl alcohols such as methanol, ethanol, n-propyl alcohol, isopropyl alcohol, n-butyl alcohol, sec-butyl alcohol, tert-butyl alcohol, isobutyl alcohol, 1-pentanol, 2-pentanol, 3-pentanol, isoamyl alcohol, 1-hexanol, 2-hexanol, 3-hexanol, etc.; as well as phenol, benzyl alcohol, etc. One or more of these may be used either singly or as combined.

As other starting materials for the polyamic acid esters and as those for other polyimide precursors and polyimides, further employed are diamines.

Diamines having a carboxyl group or a phenolic hydroxyl group are used as the starting material for the purpose of introducing an acid group into the polymers not having a carboxyl group that may be derived from the tetracarboxylic acids noted above, for example, into the polyamic acid esters, polyamidic acid amides and polyimides. As the diamines of that type, for example, preferred are aromatic diamine compounds such as 2,5-diaminobenzoic acid, 3,4-diaminobenzoic acid, 3,5-diaminobenzoic acid, 2,5-diaminoterephthalic acid, bis(4-amino-3-carboxyphenyl)methylene, bis(4-amino-3-carboxyphenyl) ether, 4,4'-diamino-3,3'-dicarboxybiphenyl, 4,4'-diamino-5,5'-dicarboxy-2,2'-dimethylbiphenyl, 1,3-diamino-4-hydroxybenzene, 1,3-diamino-5-hydroxybenzene, 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl) sulfone, bis(4-amino-3-hydroxyphenyl) sulfone, bis($^3$-amino-4-hydroxyphenyl)hexafluoropropane, bis(4-amino-3-hydroxyphenyl)hexafluoropropane, etc. One or more of these may be used either singly or as combined.

As diamines having neither a carboxyl group nor a phenolic hydroxyl group, for example, preferred are aromatic diamine compounds such as 4,4'-diaminodiphenyl ether, 4,4'-diaminodiphenylmethane, 4,4'-diaminodiphenyl sulfone, 4,4'-diaminodiphenyl sulfide, benzidine, m-phenylenediamine, p-phenylenediamine, 1,5-naphthalenediamine, 2,6-naphthalenediamine, bis(4-aminophenoxyphenyl) sulfone, bis(3-aminophenoxyphenyl) sulfone, bis(4-aminophenoxy)biphenyl, bis[4-(4-aminophenoxy)phenyl] ether, 1,4-bis(4-aminophenoxy)benzene, etc. One or more of these may be used either singly or as combined.

As still other diamines which are for improving the heat resistance of the polymers, optionally employable herein are diamine compounds having a sulfonamido group or a carboxamido group, for example, 4,4'-diaminodiphenylether-3-sulfonamide, 3,4'-diaminodiphenylether-4-sulfonamide, 3,4'-diaminodiphenylether-3'-sulfonamide, 3,3'-diaminodiphenylether-4-sulfonamide, 4,4'-diaminodiphenylether-3-carboxamide, 3,4'-diaminodiphenylether-4-carboxamide, 3,4'-diaminodiphenylether-3'-carboxamide, 3,3'-diaminodiphenylether-4-carboxamide, etc. One or more of these may be used, while combined with the diamines noted above. If combined, it is desirable that the amount of the additional diamine is at most 15 mol %, more preferably at most 10 mol % of the total amount of all diamine compounds used.

In producing the polyamic acid esters for use in the invention, tetracarboxylic acid diesters are prepared. One method of preparing the tetracarboxylic acid diesters comprises, for example, mixing a tetracarboxylic acid dianhydride such as that mentioned above and an alcohol compound such as that mentioned above, in an organic solvent in the presence of a base. In this, the ratio (by mol) of the tetracarboxylic acid dianhydride to the alcohol compound preferably falls between ½ and ½.₅, as the ratio of the former/the latter, but is most preferably ½. The reaction temperature preferably falls between 10 and 60° C., and the reaction time preferably falls between 3 and 24 hours.

The method of producing tetracarboxylic acid diester dichlorides is known. For example, thionyl chloride is dropwise added to and reacted with a tetracarboxylic acid diester as dissolved in an organic solvent to obtain them. In this reaction, the ratio (by mol) of the tetracarboxylic acid diester to the thionyl chloride preferably falls between ¹⁄₁.₁ and ½.₅, as the ratio of the former/the latter, but more preferably between ¹⁄₁.₅ and ½.₂. The reaction temperature preferably falls between –20 and 40° C., and the reaction time preferably falls between 1 and 10 hours.

The polyamic acid esters may be prepared, for example, as follows: A diamine compound such as that mentioned above, and a dehydrohalogenating agent such as pyridine or the like are dissolved in an organic solvent, then a tetracarboxylic acid diester dihalide as dissolved in an organic solvent is added to and reacted with this, and thereafter the resulting reaction mixture is poured into a bad solvent such as water or the like. The precipitate thus formed is taken out through filtration and dried to obtain the intended product, polyamic acid ester. In this process, the ratio (by mol) of the total amount of the diamine compound to the tetracarboxylic acid diester dihalide preferably falls between $^{0.6}/_1$ and $^{1}/_{0.6}$, as the ratio of the former/the latter, but more preferably between $^{0.7}/_1$ and $^{1}/_{0.7}$. The reaction temperature preferably falls between –20 and 40° C., and the reaction time preferably falls between 1 and 10 hours. The ratio (by mol) of the dehydrohalogenating agent to the tetracarboxylic acid diester dihalide preferably falls between $^{0.95}/_1$ and $^{1}/_{0.95}$, as the ratio of the former/the latter, but more preferably between $^{0.98}/_1$ and $^{1}/_{0.98}$.

In the production of the polyamic acid esters, where the additional diamine compound having neither a carboxyl group nor a phenolic hydroxyl group is used, the ratio of the diamine compound having a carboxyl group or a phenolic hydroxyl group to the additional diamine compound having neither a carboxyl group nor a phenolic hydroxyl group is preferably such that the amount of the former falls between 20 and 100 mol % while the amount of the latter falls between 0 and 80 mol %. In this, the total amount of the diamine compounds used shall be 100 mol %. More preferably, the amount of the former falls between 40 and 100 mol % while the amount of the latter falls between 0 and 60 mol %, and the total amount of the diamine compounds used shall be 100 mol %. The former diamine compound having a carboxyl group or a phenolic hydroxyl group is for making the resulting polyamic acid esters soluble in an aqueous alkaline solution. If its amount is smaller than 20 mol %, the sensitivity of the composition comprising the polymer will be low, and the developing time for the composition will have to be long.

For producing polyamidic acids for the polymer having an acid group and soluble in an aqueous alkaline solution for use in the invention, it is not always necessary to use diamine compounds having a carboxyl group or a phenolic hydroxyl group. This is because polyamidic acids have carboxyl groups that are the residues of tetracarboxylic acids used for producing them. Polyamidic acids may be prepared through direct reaction of a tetracarboxylic acid dianhydride and a diamine such as those mentioned above.

For producing polyamidic acid amides and polyimides for use in the invention, generally used are diamine compounds having a carboxyl group or a phenolic hydroxyl group. For the ratio of the diamine compound to any other diamine compound having neither a carboxyl group nor a phenolic hydroxyl group in producing them, referred to is the same as that mentioned hereinabove in the case of producing polyamic acid esters.

Briefly, polyamidic acid amides may be produced in the same manner as in the case of producing polyamic acid esters mentioned hereinabove, except that monoamine compounds are used in place of alcohol compounds. The monoamine compounds include, for example, primary amines such as methylamine, ethylamine, n-propylamine, isopropylamine, n-butylamine, sec-butylamine, tert-butylamine, isobutylamine, 1-pentylamine, 2-pentylamine, 3-pentylamine, isoamylamine, 1-hexylamine, 2-hexylamine, 3-hexylamine, etc.; secondary amines such as dimethylamine, diethylamine, di-n-propylamine, di-isopropylamine, di-n-butylamine, etc.; alicyclic amines such as piperidine, piperazine, morpholine, etc.; as well as aniline, benzylamine, etc.

Polyimides may be produced from those polyamidic acids through dehydrating ring closure.

As polyoxazole precursors for use in the invention, generally mentioned are hydroxypolyamides to be produced from starting materials of dicarboxylic acids and dihydroxydiamines.

The dicarboxylic acids include, for example, aromatic dicarboxylic acids such as isophthalic acid, terephthalic acid, 4,4'-hexafluoroisopropylidenedibenzoic acid, 4,4'-biphenyldicarboxylic acid, 4,4'-dicarboxydiphenyl ether, 4,4'-dicarboxytetraphenylsilane, bis(4-carboxyphenyl) sulfone, 2,2-bis(p-carboxyphenyl)propane, 5-tert-butylisophthalic acid, 5-bromoisophthalic acid, 5-fluoroisophthalic acid, 5-chloroisophthalic acid, 2,6-naphthalenedicarboxylic acid, etc.; aliphatic dicarboxylic acids such as 1,2-cyclobutanedicarboxylic acid, 1,4-cyclohexanedicarboxylic acid, 1,3-cyclopentanedicarboxylic acid, oxalic acid, malonic acid, succinic acid, etc. One or more of these may be used either singly or as combined. Of those, preferred are aromatic dicarboxylic acids in view of the heat resistance of the polyoxazole precursors to be produced from them.

As the dihydroxydiamines, for example, preferred are aromatic diamines such as 3,3'-diamino4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl) sulfone, bis(4-amino-3-hydroxyphenyl) sulfone, bis(3-amino-4-hydroxyphenyl)hexafluoropropane, bis(4-amino-3-hydroxyphenyl)hexafluoropropane, etc. The aromatic diamines give polybenzoxazole precursors having good heat resistance.

The polybenzoxazole precursors for use in the invention may be produced, for example, by reacting a dicarboxylic acid dihalide (e.g., chloride, bromide, etc.) with a dihydroxydiamine.

Preferably, the reaction is effected in the presence of a dehydrohalogenation catalyst in an organic solvent.

As the dicarboxylic acid dihalide, preferred are dicarboxylic acid dichlorides. The dicarboxylic acid dichlorides may be obtained by reacting a dicarboxylic acid with thionyl chloride.

The o-quinonediazide compound of the component (b) for use in the invention is a photosensitive agent having a site capable of being converted into a carboxylic acid when exposed to light. For the compound, preferably used are those to be produced through condensation of o-quinonediazidosulfonyl chlorides, hydroxy compounds and amino compounds in the presence of a dehydrochlorination catalyst.

The o-quinonediazidosulfonyl chlorides include, for example, benzoquinone-1,2-diazido-4-sulfonyl chloride, naphthoquinone-1,2-diazido-5-sulfonyl chloride, naphthoquinone-1,2-diazido-4-sulfonyl chloride, etc.

The hydroxy compounds include, for example, hydroquinone, resorcinol, pyrogallol, bisphenol A, bis(4-hydroxyphenyl)methane, 2,2-bis(4-hydroxyphenyl)hexafluoropropane, 2,3,4-trihydroxybenzophenone, 2,3,4,4'-tetrahydroxybenzophenone, 2,2',4,4'-tetrahydroxybenzophenone, 2,3,4,2',3'-pentahydroxybenzophenone, 2,3,4,3',4',5'-hexahydroxybenzophenone, bis(2,3,4-trihydroxyphenyl)methane, bis(2,3,4-trihydroxyphenyl)propane, 4b,5,9b,10-tetrahydro-1,3,6,8-tetrahydroxy-5,10-dimethylindeno[2,1-a]indene, tris(4-hydroxyphenyl)methane, tris(4-hydroxyphenyl)ethane, etc.

The amino compounds include, for example, p-phenylenediamine, m-phenylenediamine, 4,4'-diaminodiphenyl ether, 4,4'-diaminodiphenylmethane, 4,4'-diaminodiphenyl sulfone, 4,4'-diaminodiphenyl sulfide, o-aminophenol, m-aminophenol, p-aminophenol, 3,3'-diamino-4,4'-dihydroxybiphenyl, 4,4'-diamno-3,3'-dihydroxybiphenyl, bis(3-amino-4-hydroxyphenyl)propane, bis(4-amino-3-hydroxyphenyl)propane, bis(3-amino-4-hydroxyphenyl) sulfone, bis(4-amino-3-hydroxyphenyl) sulfone, bis(3-amino-4-hydroxyphenyl)hexafluoropropane, bis(4-amino-3-hydroxyphenyl)hexafluoropropane, etc.

For their condensation, it is desirable that the o-quinonediazidosulfonyl chloride and the hydroxy compound and/or the amino compound are so controlled that the sum total of the hydroxy group and the amino group is from 0.5 to 1 equivalent relative to one mol of the o-quinonediazidosulfonyl chloride. Preferably, the ratio of the dehydrochlorination catalyst to the o-quinonediazidosulfonyl chloride falls between $0.95/1$ and $1/0.95$.

Also preferably, the reaction temperature falls between 0 and 40° C., and the reaction time falls between 1 and 10 hours.

As the reaction solvent, usable is any of dioxane, acetone, methyl ethyl ketone, tetrahydrofuran, diethyl ether, N-methylpyrrolidone, etc.

The dehydrochlorination catalyst includes, for example, sodium carbonate, sodium hydroxide, sodium hydrogencarbonate, potassium carbonate, potassium hydroxide, trimethylamine, triethylamine, pyridine, etc.

In the photosensitive polymer composition of the invention, the amount of the component (b) preferably falls between 5 and 100 parts by weight, more preferably between 10 and 40 parts by weight, relative to 100 parts by weight of the component (a), in view of the dissolution rate difference between the exposed area and the unexposed area of the film of the composition, and of the latitude in the sensitivity of the composition.

The component (c) to be in the composition of the invention is a dissolution inhibitor for the component (a) in an aqueous alkaline solution, or that is, it is a compound effective for retarding the dissolution of the component (a) in an aqueous alkaline solution. As combined with the component (b), the component (c) acts to lower the dissolution rate of the unexposed area when the exposed film of the composition is developed with an aqueous alkaline solution, whereby the solubility difference between the exposed area and the unexposed area is increased to give better patterns.

As the dissolution inhibitor (c) for the component (a) in an aqueous alkaline solution, preferred are onium salts, diaryl compounds and tetraalkylammonium salts. The onium salts include, for example, iodonium salts such as diaryliodonium salts, etc.; sulfonium salts such as triarylsulfonium salts, etc.; phosphonium salts; diazonium salts such as aryldiazonium salts, etc. The diaryl compounds include, for example, those having two aryl groups as bonded to each other via a bonding group therebetween, such as diaryl sulfones, diaryl ketones, diaryl ethers, diarylpropanes, diarylhexafluoropropanes, etc. The tetraalkylammonium salts include, for example, tetraalkylammonium halides in which the alkyl group may be a methyl group, an ethyl group or the like.

Of those, the dissolution inhibition effect of diaryliodoniun salts, diarylurea compounds diaryl sulfone compounds and tetramethylammonium halide compounds is good. For example, the diaryliodonim salts include diphenyliodonium salts, etc.; the diarylurea compounds include diphenylurea, dimethyldiphenylurea, etc.; the diaryl sulfone compounds include diphenyl sulfone, dimethyldiphenyl sulfone, etc.; the tetramethylammonium halide compounds include tetramethylammonium chloride, tetramethylammonium bromide, tetramethylammonium iodide, etc.

Above all, preferred are diaryliodonium salts of the following general formula (II):

wherein $R^4$ and $R^5$ each independently represent a monovalent organic group (preferably having from 1 to 20 carbon atoms), for example, an alkyl group such as a methyl group, an ethyl group, a propyl group or the like, or an alkoxy group such as a methoxy group, an ethoxy group, a propoxy group or the like, or an aryl group such as a phenyl group, and these $R^4$ and $R^5$ may be the same or different; m and n each independently represent an integer of from 0 to 5; and X represents a counter anion. Preferred examples of the counter anion include nitrato ions, sulfonato ions, iodide ions, borato ions, etc.

Specific examples of the compounds of formula (II) include diphenyliodonium nitrate, diphenyliodonium trifluoromethanesulfonate, diphenyliodonium nanofluorobutanesulfonate, diphenyliodonium toluenesulfonate, diphenyliodonim chloride, diphenyliodonium bromide, diphenyliodonium iodide, diphenyliodonium hexafluorophosphate, diphenyliodonium 9,10-dimethoxyanthracene-2-sulfonate, diphenyliodonium 8-anilinonaphthalene-1-sulfonate, 4-methoxydiphenyliodonium nitrate, 4-methoxydiphenyliodonium trifluoromethanesulfonate, 4,4'-di-t-butyldiphenyliodonium trifluoromethanesulfonate, etc.

Of those, more preferred are diphenyliodonium nitrate, diphenyliodonium trifluoromethanesulfonate, diphenyliodonium 8-anilinonaphthalene-1-sulfonate and 4-methoxydiphenyliodonium trifluoromethanesulfonate, as their effect is higher.

In the photosensitive polymer composition of the invention, the amount of the component (c) preferably falls between 0.01 and 30 parts by weight, more preferably between 0.01 and 10 parts by weight, even more preferably between 0.1 and 5 parts by weight, still more preferably between 0.05 and 3 parts by weight, further more preferably between 0.1 and 2 parts by weight, relative to 100 parts by weight of the component (a), in view of the latitude in the sensitivity of the composition and of that in the development time for the composition.

The photosensitive polymer composition of the invention may be prepared by dissolving the components (a), (b) and (c) in a solvent.

As the solvent, for example, preferred is an aprotic polar solvent such as N-methyl-2-pyrrolidone (NMP), N,N-dimethylformamide, N,N-dimethylacetamide, dimethylsulfoxide, hexamethylphosphonylamide, tetramethylene sulfone, γ-butyrolactone, etc. One or more of these may be used either singly or as combined.

For the purpose of improving the coatability of the composition, any other solvent, such as diethyl ketone, diisobutyl ketone, methyl amyl ketone, ethyl lactate, propylene glycol monomethyl ether acetate or the like, may be combined with the solvent noted above.

Though not specifically defined, the amount of the solvent to be in the composition is generally so controlled that it may be from 20 to 90% by weight of the composition.

If desired, the photosensitive polymer composition of the invention may optionally contain, as an adhesiveness promoter, any of organic silane compounds, aluminium chelate compounds and polyamidic acids having repetitive units of the following general formula (IV):

(IV)

wherein $R^9$ represents a tetravalent organic group; $R^{10}$ represents a divalent organic group; $R^{11}$ represents a monovalent organic group; and q represents an integer of 1 or more.

The organic silane compounds include, for example, γ-aminopropyltrimethoxysilane, γ-aminopropyltriethoxysilane, vinyltriethoxysilane, γ-glycidoxypropyltriethoxysilane, γ-methacryloxypropyltrimethoxysilane, ureidopropyltriethoxysilane, etc.

The aluminium chelate compounds include, for example, tris(acetylacetonato)aluminium, acetylacetonatoaluminium diisopropionate, etc.

In the polyamidic acids having the siloxane structure that comprises the repetitive units of formula (IV), the tetravalent organic group represented by $R^9$ is a residue of a tetracarboxylic acid dianhydride that may the starting compound for polyimides, and it is preferably a tetravalent aromatic or aliphatic group, more preferably having from 4 to 40 carbon atoms. Even more preferably, it is a tetravalent aromatic group having from 4 to 40 carbon atoms. It is desirable that, in the tetravalent aromatic group, the four bonding sites are all on the aromatic ring. The bonding sites are grouped into two pairs, and it is desirable that the two bonding sites of each one pair are positioned on the neighboring carbon atoms in the aromatic ring (that is, in the ortho-position in the aromatic ring). The two pairs of the bonding sites may be on one and the same aromatic ring, or may be on different aromatic rings as bonded to each other in any desired bonding manner.

In formula (IV), the part as sandwiched between the two $R^{10}$'s is a residue of a siliconediamine compound from which the amino groups are removed, and it is desirable that this part has from 6 to 40 carbon atoms in all. The divalent organic group represented by $R^{10}$ preferably has from 1 to 10 carbon atoms, including, for example, an alkylene group, a phenylene group or the like in which the number of carbon atoms falls within the preferred range. Those two $R^{10}$'s may be the same or different. The monovalent organic group represented by $R^{11}$ preferably has from 1 to 7 carbon atoms, including, for example, an alkyl group or a phenyl group in which the number of carbon atoms falls within the preferred range.

In the composition of the invention, the amount of the adhesiveness promoter, if any, preferably falls between 0.1 and 20 parts by weight, more preferably between 1 and 10 parts by weight, relative to 100 parts by weight of the component (a).

The photosensitive polymer composition of the invention may be formed into resin relief patterns in a process comprising a step of applying the composition onto a substrate and drying it thereon, a step of exposing it, a step of developing it and a step of heating it.

In the coating and drying step, the photosensitive polymer composition is applied onto a substrate of, for example, glass, semiconductors, metal oxide insulators (e.g., $TiO_2$, $SiO_2$, etc.), silicon nitride or the like, through spin coating with a spinner or the like, and then dried thereon, for example, on a hot plate or in an oven or the like.

In the next exposing step, the film of the photosensitive polymer composition formed on the substrate is exposed to active rays, such as ultraviolet rays, visible rays, radiations or the like, via a mask.

In the next developing step, the exposed area is removed with a developer to form a pattern on the substrate. As preferred examples of the developer, mentioned are aqueous alkaline solutions of, for example, sodium hydroxide, potassium hydroxide, sodium silicate, ammonia, ethylamine, diethylamine, triethylamine, triethanolamine, tetramethylammonium hydroxide or the like. The base concentration in those aqueous solutions preferably falls between 0.1 and 10% by weight. If desired, the developer may additionally contain any of alcohols and surfactants. The amount of the additive preferably falls between 0.01 and 10 parts by weight, more preferably between 0.1 and 5 parts by weight, relative to 100 parts by weight of the developer.

In the next heating step, the pattern formed in the previous step is heated preferably at a temperature falling between 150 and 450° C., whereby it is formed into a relief pattern of a heat-resistant polyimide, polybenzoxazole or the like having an imido ring, an oxazole ring or any other cyclic group.

The photosensitive polymer composition of the invention may be used in electronic parts such as semiconductor devices, multi-layered interconnection boards, etc. Concretely, it may be used for forming passivating films and interlayer insulating films in semiconductor devices, or for forming interlayer insulating films in multi-layered interconnection boards, etc.

The semiconductor devices of the invention are not specifically defined so far as they have passivating films or interlayer insulating films made from the composition, and may have various structures.

One example of the process for fabricating the semiconductor device of the invention is mentioned below.

FIG. 1A to FIG. 1E show a process for fabricating a semiconductor device having a multi-layered interconnection structure. As illustrated, the semiconductor substrate 1 of, for example, Si or the like which has a circuit element is coated with a protective film 2 of, for example, silicon oxide or the like, except for the predetermined part of the circuit element, and a first conductor layer 3 is formed on the exposed circuit element. The semiconductor substrate is coated with a film 4 of, for example, a polyimide resin or the like that acts as an interlayer insulating film, according to a spin-coating method or the like (step of FIG. 1A).

Figure 1A:
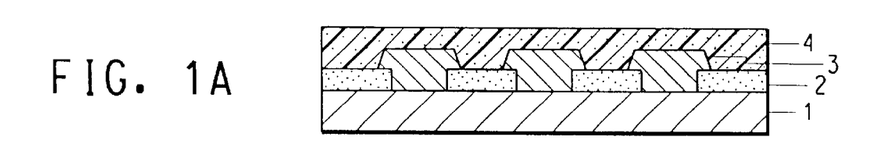
FIG. 1A to FIG. 1E show a process for fabricating a semiconductor device having a multi-layered interconnection structure. The numbers refer to the following.
Figure 1B:
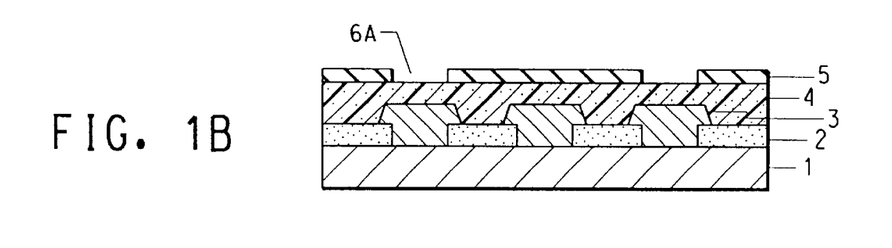
Figure 1C:
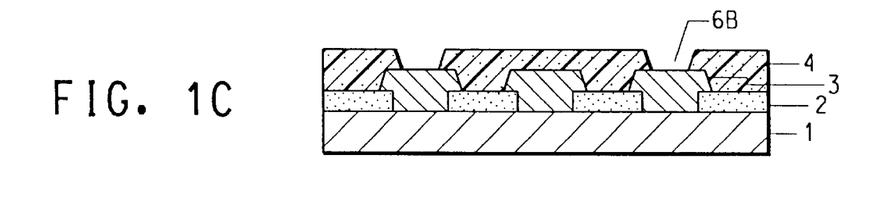

Next, a rubber chloride-based or phenol-novolak-based, photosensitive resin layer 5 is formed on the interlayer insulating film 4 according to a spin-coating method, and windows 6A are formed, through which a predetermined part of the interlayer insulating film 4 is exposed outside, according to a known photolithographic technique (step of FIG. 1B).

The interlayer insulating film 4 below each window 6A is selectively etched according to a dry etching method for which is used oxygen, carbon tetrafluoride or the like vapor, to give windows 6B. Next, the photosensitive resin layer 5 is completely removed with an etching solution capable of etching the photosensitive resin layer 5 only, but not etching the first conductor layer 3 exposed outside through the windows 6B (step of FIG. 1C).

Figure 1D:
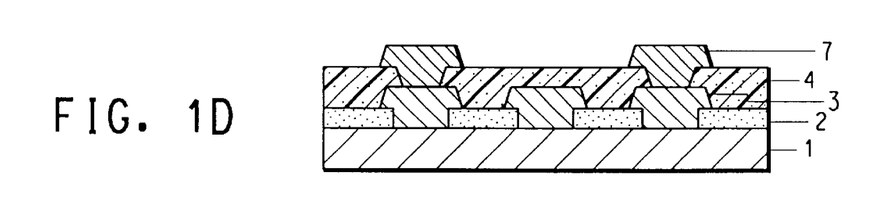

Next, according to a known photolithographic technique, a second conductor layer 7 is formed, which is completely electrically connected with the first conductor layer 3 (step of FIG. 1D).

For forming a multi-layered interconnection structure having 3 or more layers, the steps illustrated are repeated for each layer.

Figure 1E:
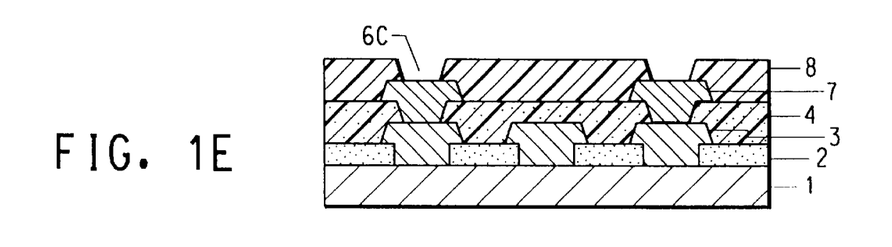

Next, a passivating film 8 is formed (step of FIG. 1E). In this example illustrated, the passivating film is formed according to a spin-coating method, in which the photosensitive polymer composition of the invention is applied onto the wafer and dried thereon, then this is exposed to light via a mask having a pattern for windows 6C to be formed in predetermined parts, and thereafter developed with an aqueous alkaline solution to give a predetermined pattern, and the pattern is then heated to be of a polyimide film. The polyimide film protects the conductor layer from external stress, α-rays and others, and the semiconductor device thus fabricated has good reliability.

In the example illustrated, the interlayer insulating film may also be formed from the photosensitive polymer composition of the invention.

The invention is described in more detail with reference to the following Examples, which, however, are not intended to restrict the scope of the invention.

EXAMPLE 1

24.82 g (0.08 mols) of 3,3',4,4'-diphenylether-tetracarboxylic acid dianhydride, 11.86 g (0.16 mols) of n-butyl alcohol, 0.37 g (0.0024 mols) of 1,8-diazabicyclo[5.4.0]-7-undecene and 135 g of NMP were put into a 0.5-liter flask equipped with a stirrer and a thermometer, and stirred and reacted therein at room temperature for 15 hours to obtain an NMP solution of di-n-butyl 3,3',4,4'-diphenylether-tetracarboxylate.

Next, the flask was cooled at 0° C., to which was dropwise added 15.23 g (0.128 mols) of thionyl chloride, and this was reacted with the ester for 1 hour to give a solution (α) of di-n-butyl 3,3',4,4'-diphenylether-tetracarboxylate dichloride.

On the other hand, 94 g of N-methylpyrrolidone was put into a 0.5-liter flask equipped with a stirrer and a thermometer, to which was added 23.44 g (0.064 mols) of bis(3-amino-4-hydroxyphenyl)hexafluoropropane, and dissolved with stirring. Next, 20.25 g of pyridine was added thereto, and thereafter the solution (α) of di-n-butyl 3,3',4,4'-diphenylether-tetracarboxylate dichloride was dropwise added thereto over a period of 20 minutes with the temperature in the flask being kept at 0 to 5° C., and then further stirred for 1 hour. The resulting solution was poured into 4 liters of water, and the precipitate thus formed was collected, washed and then dried under reduced pressure to give polyamic acid n-butyl ester.

15.00 g of the polyamic acid n-butyl ester, 2.25 g of an orthoquinonediazide compound as prepared by reacting tris(4-hydroxyphenyl)methane and naphthoquinone-1,2-diazido-4-sulfonyl chloride in a ratio by mol of 1/2.9, 0.15 g of diphenyliodonium nitrate, and 0.30 g of a methanol solution of 50 wt. % ureidopropyltriethoxysilane were dissolved in 23.00 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 7.5 μm film on the wafer. The film was then exposed to i-line of from 100 to 500 mJ/cm$^2$ via a reticle, using an exposing device, i-line stepper (from Hitachi). Next, this was developed with a developer, aqueous solution of 2.38 wt. % tetramethylammonium hydroxide for 60 seconds, using a paddle, and then rinsed with pure water to form a pattern. From the pattern observation, it was known that the suitable exposure dose in this case is 250 mJ/cm$^2$. Through that exposure, the pattern formed had a good profile. The firm retention in the unexposed area was 82%. The pattern was heated in a nitrogen atmosphere at 350° C. for 1 hour. The relief pattern of the polyimide film thus formed had a good profile.

EXAMPLE 2

15.00 g of the polyamic acid n-butyl ester as prepared in Example 1, 2.25 g of an orthoquinonediazide compound as prepared by reacting tris(4-hydroxyphenyl)methane and naphthoquinone-1,2-diazido-4-sulfonyl chloride in a ratio by mol of 1/2.9, 0.15 g of diphenyliodonium trifluoromethanesulfonate, and 0.30 g of a methanol solution of 50 wt. % ureidopropyltriethoxysilane were dissolved in 23.00 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 7.5 μm film on the wafer. The film was then exposed to i-lines of from 100 to 500 mJ/cm$^2$ via a reticle, using an exposing device, i-line stepper (from Hitachi). Next, this was developed with a developer, aqueous solution of 2.38 wt. % tetramethylanmonium hydroxide for 35 seconds, using a paddle, and then rinsed with pure water to form a pattern. From the pattern observation, it was known that the suitable exposure dose in this case is 300 mJ/cm$^2$. Through that exposure, the pattern formed had a good profile. The firm retention in the unexposed area was 81%. The pattern was heated in a nitrogen atmosphere at 350° C. for 1 hour. The relief pattern of the polyimide film thus formed had a good profile.

EXAMPLE 3

15.00 g of the polyamic acid n-butyl ester as prepared in Example 1, 2.25 g of a compound as prepared by reacting tris(4-hydroxyphenyl)methane and naphthoquinone-1,2-diazido-4-sulfonyl chloride in a ratio by mol of ½:2.9, 0.20 g of diphenyliodonium 8-anilinonaphthalene-l-sulfonate, and 0.30 g of a methanol solution of 50 wt. % ureidopropyltriethoxysilane were dissolved in 23.00 g of NMP with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 100° C. for 3 minutes to form a 6.8 μm positive film of the composition on the wafer. The photosensitive polyimide precursor film was then exposed to i-lines of from 100 to 500 mJ/cm$^2$ via a reticle, using an i-line stepper, LD-5010i Model (from Hitachi). Next, this was developed with a developer, aqueous solution of 2.38 wt. % tetramethylammonium hydroxide for 30 seconds, using a paddle, and then rinsed with pure water to form a pattern. From the pattern observation, it was known that the suitable exposure dose in this case is 400 mJ/cm$^2$. Through that exposure, the pattern formed had a good profile. The firm retention in the unexposed area was 80%. The pattern was heated in a nitrogen atmosphere at 350° C. for 1 hour. The relief pattern of the polyimide film thus formed had a good profile.

EXAMPLE 4

15.00 g of the polyamic acid n-butyl ester as prepared in Example 1, 2.25 g of a compound as prepared by reacting tris(4-hydroxyphenyl)methane and naphthoquinone-1,2-diazido4-sulfonyl chloride in a ratio by mol of ½:2.9, 0.15 g of diphenylurea, and 0.30 g of a methanol solution of 50 wt. % ureidopropyltriethoxysilane were dissolved in 23.00 g of NMP with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 7.4 μm positive film of the composition on the wafer. The photosensitive polyimide precursor film was then exposed to i-lines of from 100 to 500 mJ/cm$^2$ via a reticle, using an i-line stepper, LD-5010i Model (from Hitachi). Next, this was developed with a developer, aqueous solution of 2.38 wt. % tetramethylammonium hydroxide for 23 seconds, using a paddle, and then rinsed with pure water to form a pattern. From the pattern observation, it was known that the suitable exposure dose in this case is 400 mJ/cm$^2$. Through that exposure, the pattern formed had a good profile. The firm retention in the unexposed area was 80%. The pattern was heated in a nitrogen atmosphere at 350° C. for 1 hour. The relief pattern of the polyimide film thus formed had a good profile.

EXAMPLE 5

15.00 g of the polyamic acid n-butyl ester as prepared in Example 1, 2.25 g of a compound as prepared by reacting tris(4-hydroxyphenyl)methane and naphthoquinone-1,2-diazido-4-sulfonyl chloride in a ratio by mol of ½:2.9, 0.15 g of 4-methoxydiphenyliodonium trifluoromethanesulfonate, and 0.30 g of a methanol solution of 50 wt. % ureidopropyltriethoxysilane were dissolved in 23.00 g of NMP with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 7.5 μm positive film of the composition on the wafer. The photosensitive polyimide precursor film was then exposed to i-lines of from 100 to 500 mJ/cm$^2$ via a reticle, using an i-line stepper, LD-5010i Model (from Hitachi). Next, this was developed with a developer, aqueous solution of 2.38 wt. % tetramethylammonium hydroxide for 39 seconds, using a paddle, and then rinsed with pure water to form a pattern. From the pattern observation, it was known that the suitable exposure dose in this case is 300 mJ/cm$^2$. Through that exposure, the pattern formed had a good profile. The firm retention in the unexposed area was 80%. The pattern was heated in a nitrogen atmosphere at 350° C. for 1 hour. The relief pattern of the polyimide film thus formed had a good profile.

EXAMPLE 6

15.00 g of the polyamic acid n-butyl ester as prepared in Example 1, 2.25 g of a compound as prepared by reacting tris(4-hydroxyphenyl)methane and naphthoquinone-1,2-diazido4-sulfonyl chloride in a ratio by mol of ½:2.9, 0.15 g of tetramethylammoniumn chloride, and 0.30 g of a methanol solution of 50 wt. % ureidopropyltriethoxysilane were dissolved in 23.00 g of NMP with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 7.8 μm positive film of the composition on the wafer. The photosensitive polyimide precursor film was then exposed to i-lines of from 100 to 500 mJ/cm$^2$ via a reticle, using an i-line stepper, LD-5010i Model (from Hitachi). Next, this was developed with a developer, aqueous solution of 2.38 wt. % tetramethylammonium hydroxide for 35 seconds, using a paddle, and then rinsed with pure water to form a pattern. From the pattern observation, it was known that the suitable exposure dose in this case is 250 mJ/cm$^2$. Through that exposure, the pattern formed had a good profile. The firm retention in the unexposed area was 80%. The pattern was heated in a nitrogen atmosphere at 350° C. for 1 hour. The relief pattern of the polyimide film thus formed had a good profile.

EXAMPLE 7

21.69 g (0.084 mols) of 4,4'-diphenylether-dicarboxylic acid and 123 g of NMP were put into a 0.5-liter flask equipped with a stirrer and a thermometer. Then, the flask was cooled at 0° C., to which was dropwise added 19.99 g (0.168 mols) of thionyl chloride, and reacted with the acid for 1 hour to give a solution (β) of 4,4'-diphenylether-dicarboxylic acid chloride.

On the other hand, 103 g of N-methylpyrrolidone was put into a 0.5-liter flask equipped with a stirrer and a thermometer, to which was added 25.83 g (0.1 mols) of bis(3-amino-4-hydroxyphenyl)hexafluoropropane, and dissolved with stirring. Next, 26.58 g of pyridine was added thereto, and thereafter the solution (β) of 4,4'-diphenylether-docarboxylic acid chloride was dropwise added thereto over a period of 20 minutes with the temperature in the flask being kept at 0 to 5° C., and then further stirred for 1 hour. The resulting solution was poured into 4 liters of water, and the precipitate thus formed was collected, washed and then dried under reduced pressure to give polyhydroxyamide.

15.00 g of the polyhydroxyamide, 2.25 g of an orthoquinonediazide compound as prepared by reacting tris(4- hydroxyphenyl)methane and naphthoquinone-1,2-diazido-4-sulfonyl chloride in a ratio by mol of ½.9, 0.15 g of diphenyliodonium nitrate, and 0.30 g of a methanol solution of 50 wt. % ureidopropyltriethoxysilane were dissolved in 23.00 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 7.4 μm film on the wafer. The film was then exposed to i-lines of from 100 to 500 mJ/cm² via a reticle, using an exposing device, i-line stepper (from Hitachi). Next, this was developed with a developer, aqueous solution of 2.38 wt. % tetramethylamnonium hydroxide for 90 seconds, using a paddle, and then rinsed with pure water to form a pattern. From the pattern observation, it was known that the suitable exposure dose in this case is 350 mJ/cm². Through that exposure, the pattern formed had a good profile. The firm retention in the unexposed area was 80%. The pattern was heated in a nitrogen atmosphere at 350° C. for 1 hour. The relief pattern of the polybenzoxazole film thus formed had a good profile.

COMPARATIVE EXAMPLE 1

15.00 g of the polyamic acid n-butyl ester as prepared in Example 1, 2.25 g of an orthoquinonediazide compound as prepared by reacting tris(4-hydroxyphenyl)methane and naphthoquinone-1,2-diazido-4-sulfonyl chloride in a ratio by mol of ½.9, and 0.30 g of a methanol solution of 50 wt. % ureidopropyltriethoxysilane were dissolved in 23.00 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 7.5 μm film on the wafer. The film was then exposed to i-lines of from 100 to 500 mJ/cm² via a reticle, using an exposing device, i-line stepper (from Hitachi). Next, this was developed with a developer, aqueous solution of 2.38 wt. % tetramethylammonium hydroxide for 13 seconds, using a paddle, and then rinsed with pure water to form a pattern. From the pattern observation, it was known that the suitable exposure dose in this case is 450 mJ/cm². The firm retention in the unexposed area was 80%.

COMPARATIVE EXAMPLE 2

15.00 g of the polyhydroxyamide as prepared in Example 7, 2.25 g of an orthoquinonediazide compound as prepared by reacting tris(4-hydroxyphenyl)methane and naphthoquinone-1,2-diazido-4-sulfonyl chloride in a ratio by mol of ½.9, and 0.30 g of a methanol solution of 50 wt. % ureidopropyltriethoxysilane were dissolved in 23.00 g of N-methylpyrrolidone with stirring. The resulting solution was filtered under pressure through a 3 μm-Teflon filter to obtain a photosensitive polymer composition.

The thus-obtained photosensitive polymer composition was applied onto a silicon wafer through spin-coating, using a spinner, and then heated and dried on a hot plate at 110° C. for 3 minutes to form a 7.4 μm film on the wafer. The film was then exposed to i-lines of from 100 to 500 mJ/cm² via a reticle, using an exposing device, i-line stepper (from Hitachi). Next, this was developed with a developer, aqueous solution of 2.38 wt. % tetramethylammonium hydroxide for 30 seconds, using a paddle, and then rinsed with pure water. In this case, however, the intended pattern could not be formed even when the exposure dose was 500 mJ/cm². The firm retention in the unexposed area was 77%.

As has been described in detail hereinabove, the photosensitive polymer composition of the invention as herein claimed in claims 1 to 10 has high sensitivity and is capable of being formed into patterns having a good profile. In patterning the composition, the firm retention in the unexposed area is high.

In particular, the photosensitive polymer composition as claimed in claims 2 to 4 has extremely good heat resistance.

In the method for forming relief patterns as claimed in claims 11 and 12, the composition used has high sensitivity and the relief patterns formed have a good profile. In this, the firm retention in the unexposed area is high.

The electronic parts as claimed in claims 13 and 14 have fine relief patterns, in which the relief patterns formed have a good profile and which therefore have high reliability.

While the invention has been described in detail and with reference to specific embodiments thereof, it will be apparent to one skilled in the art that various changes and modifications can be made therein without departing from the spirit and scope thereof.

What is claimed is:

1. A photosensitive polymer composition comprising:
   (a) a polymer soluble in an aqueous alkaline solution;
   (b) an o-quinonediazide compound; and
   (c) a dissolution inhibitor for the component (a) in an aqueous alkaline solution; and
   wherein (a) is selected from the group consisting of
   (1) a polybenzoxazole precursor soluble in an aqueous alkaline solution; and
   (2) a polyamidate having repetitive units of a general formula (I):

(I)

wherein $R^1$ represents a tetravalent organic group; $R^2$ represents a divalent organic group having a phenolic hydroxyl group; and two $R^3$'s each independently represent an aliphatic hydrocarbon group or an aromatic hydrocarbon group.

2. The photosensitive polymer composition as claimed in claim 1, wherein the component (a) is (1).

3. The photosensitive polymer composition as claimed in claim 1, wherein the component (a) is (2).

4. The photosensitive polymer composition as claimed in claim 1, wherein the component (c) is any of onium salts, diaryl compounds or tetraalkylammonium salts.

5. The photosensitive polymer composition as claimed in claim 3, wherein the component (c) is any of onium salts, diaryl compounds or tetraalkylammonium salts.

6. The photosensitive polymer composition as claimed in claim 2, wherein the component (c) is any of onium salts, diaryl compounds or tetraalkylammonium salts.

7. The photosensitive polymer composition as claimed in claim 1, wherein the component (c) is any of diaryliodonium salts, diaryl sulfone compounds or tetramethylammonium halide compounds.

8. The photosensitive polymer composition as claimed in claim 7, wherein the component (c) is a diaryliodonium salt of a general formula (II):

wherein $R^4$ and $R^5$ each independently represent a monovalent organic group, and these $R^4$ and $R^5$ may be the same or different; m and n each independently represent an integer of from 0 to 5; and $X^-$ represents a counter anion.

9. The photosensitive polymer composition as claimed in claim 1, which comprises from 5 to 100 parts by weight of the component (b) and from 0.01 to 30 parts by weight of the component (c), relative to 100 parts by weight of the component (a).

10. A method for forming relief patterns, which comprises a step of applying the photosensitive polymer composition of claim 1 onto a substrate and drying it thereon, a step of exposing it, a step of developing it with an aqueous alkaline solution, and a step of heating it.

11. The method for forming relief patterns as claimed in claim 10, wherein the light to be used in the exposing step is of i-lines.

* * * * *